United States Patent
Nakajima et al.

[11] Patent Number: 5,091,114
[45] Date of Patent: Feb. 25, 1992

[54] CONDUCTIVE METAL POWDERS, PROCESS FOR PREPARATION THEREOF AND USE THEREOF

[75] Inventors: Hitoshi Nakajima; Akinori Yokoyama, both of Kurashiki, Japan

[73] Assignee: Asahi Kasei Kogyo Kabushiki Kaisha, Osaka, Japan

[21] Appl. No.: 395,531

[22] Filed: Aug. 18, 1989

[30] Foreign Application Priority Data

Aug. 23, 1988 [JP] Japan ................. 63-207438
Jan. 27, 1989 [JP] Japan ................. 1-016425

[51] Int. Cl.$^5$ ............................... H01B 1/06
[52] U.S. Cl. ..................... 252/514; 252/512; 252/513; 252/518; 523/458; 523/459; 524/434; 524/435; 428/570
[58] Field of Search ............ 75/251; 252/512, 513, 252/514, 518; 106/1.18, 1.27, 1.19, 1.26, 20, 1.05; 523/137, 457–459; 524/434, 435

[56] References Cited

U.S. PATENT DOCUMENTS

| | | | |
|---|---|---|---|
| 3,202,488 | 8/1965 | Ehrreich et al. | 252/514 |
| 3,253,783 | 5/1966 | Probst | 239/82 |
| 3,305,356 | 2/1967 | Youdelis | 75/134 |
| 3,583,930 | 6/1971 | Ehrreich et al. | 252/514 |
| 3,871,876 | 3/1975 | Asgar | 75/169 |
| 4,235,631 | 11/1980 | Aliotta | 75/251 |
| 4,450,188 | 5/1984 | Kawasumi et al. | 252/513 |
| 4,600,604 | 7/1986 | Siuta | 252/512 |
| 4,652,465 | 3/1987 | Koto | 427/216 |
| 4,683,082 | 7/1987 | Ehrreich | 252/514 |
| 4,836,955 | 6/1989 | Ehrreich | 250/512 |
| 4,859,241 | 8/1989 | Grundy | 252/514 |

FOREIGN PATENT DOCUMENTS 0225700 6/1987 European Pat. Off. .

*Primary Examiner*—Josephine Barr
*Attorney, Agent, or Firm*—Fleit, Jacobson, Cohn, Price, Holman & Stern

[57] ABSTRACT

Conductive metal powders having high conductivity with minimized silver migration are characterized in that an average composition is represented by $Ag_x M_{1-x}$ (wherein M is at least one metal selected from Ni, Co, Cu and Fe; $0.01 \leq x \leq 0.4$) and has a region wherein a silver concentration progressively increases on moving from the inner part toward the surface. The conductive metal powders, which are useful as leads, electrodes and shielding from electromagnetic interference are prepared by solidifying rapidly a molten metal having the specific composition.

13 Claims, 3 Drawing Sheets

CONDUCTIVE METAL POWDERS, PROCESS FOR PREPARATION THEREOF AND USE THEREOF

BACKGROUND OF THE INVENTION

1. Field of the Invention

The present invention relates to conductive metal powders having excellent resistance to oxidation and minimum electromigration. They are used for electromagnetic shielding and for preventing static charges or, alternatively, as conductive materials, etc. The present invention also relates to a process for preparation and use of the conductive metal powders.

2. Related Art

As conductive powders, silver, copper, nickel, cobalt, iron, stainless steel, carbon or silver-plated copper powders are known (Japanese Patent Publication No. 47-3019, Japanese Patent Application Laid-Open Nos. 60-243277 and 61-163975).

There are problems associated with each of the conductive powders known to the prior art. For example, silver is a rare metal and expensive and also susceptible to electromigration. Copper, nickel, cobalt, iron and stainless steel suffer from serious reduction in conductivity. The reduction in conductivity results from oxidation of the surface material. Conductivity of carbon is insufficient. Silver plating not only involves complicated and troublesome plating steps but also plated silver tends to deteriorate quickly and peel-off due to poor adhesion of silver and is susceptible to electromigration.

U.S. Pat. No. 3,305,356 discloses a method for preparing powders by atomizing a silver-copper eutectic alloy (72% by weight silver) in a nitrogen atmosphere at a temperature of 875° C. at 100 p.s.i., which was the upper limit of pressure for a gas atomization apparatus at that time.

Powders of alloys of silver, tin, and copper, used for dental amalgams, are known. For example, in U.S. Pat. No. 3,871,876 (corresponding to Japanese Patent Publication No. 54-35860), there is disclosed a method for preparing spheroidal powders which comprises gas atomization of a molten mass composed of silver, tin and copper using a gaseous stream (advantageously an inert gas stream), following the teaching of U.S. Pat. No. 3,253,783. U.S. Pat. No. 3,253,783 discloses that the pressure of atomized gas is in the range of 70 to 1000 p.s.i.

According to U.S. Pat. No. 3,871,876 molten fine-sized droplets of the desired composition are cooled in a manner to effect progressive solidification during cooling, commencing on the surface and moving inwardly thereof. Tin solidifies in the inner part in a high concentration since its melting point is lower than that of each of the other metals present. As a result, the outer surface of each particle contains a higher concentration of copper and silver and thus has a higher melting point, whereas the tin-rich phase, which has a lower melting point, is concentrated in the inner part of each particle. When the particles are washed with a hydrochloric acid solution, tin present on the surface is dissolved from the outer surface so that the concentration of silver and copper on the surface increases and, at the same time, the surface of the particles becomes spongy in appearance. {Since the ionization tendency decreases in the order of tin, copper and silver [cf., e.g., RIKAGAKU JITEN (Encyclopedia of Physics and Chemistry), 4th edition, page 64, published by IWANAMI Publishing Co., Tokyo, Japan], when the particles are washed with an aqueous hydrochloric acid solution, tin is dissolved mainly from the surface in the largest amount among the three kinds of metals; copper is dissolved in a less amount than that of tin; and silver is not dissolved at all}. In the powders prepared by this method, it is said that the surface of the particle is silver-rich, the inner part is tin-rich and copper is uniformly distributed in general. Presumably, the structure of alloy powders disclosed in this prior art would be derived from the procedure stated below: As droplets of a molten metal begin to solidify at their surface and progressively toward the core, silver and copper (which solidify at an early stage, owing to their higher melting points) solidify at the surface, and tin, which solidifies at a later stage owing to its lower melting point, solidifies in the inner part. In the succeeding washing procedure with an aqueous hydrochloric acid solution, metals in the surface dissolve out in the order of $Sn > Cu > Ag = 0$ in accordance with a decrease in the ionization tendency. Since both silver and copper solidify on the surface in a higher concentration during the course of the gas atomization procedure, the difference between silver and copper in their distribution in the particle is presumably caused during the course of washing with hydrochloric acid.

SUMMARY OF THE INVENTION

An object of the present invention is to provide conductive metal powder which contains a small amount of silver. The powder has a high conductivity, is free of reduction in conductivity with passage of time, and is virtually free from electromigration. Another object of the present invention is to provide a method for use of such conductive metal powder.

The term "electromigration" as used herein refers to a phenomenon in which silver migrates between silver conductors separated by insulators in an electric field to lead to deteriorated insulation and shorting. The phenomenon involves electrochemical phenomena, i.e., ionization of silver, and is accelerated by the hygroscopicity of insulators.

As a result of extensive investigation on conductive powder free of the foregoing problems, the present inventors have discovered conductive metal powder characterized in that an average composition is represented by $Ag_x M_{1-x}$ (wherein M is at least one metal selected from Ni, Co, Cu and Fe; $0.01 \leq x \leq 0.4$) and has a region wherein silver concentration progressively increases on moving from the core or inner part toward the surface.

DETAILED DESCRIPTION OF PREFERRED EMBODIMENTS

Figure 1:
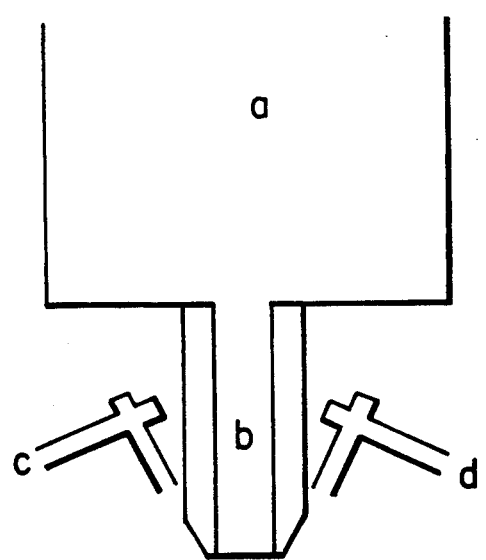
FIG. 1 shows the core part of a high pressure gas atomization apparatus, wherein symbol "a" is a crucible for melting a metal; symbol "b" is a nozzle equipped with the crucible; symbols "c" and "d" are a plurality of nozzles for atomizing gas which surrounds "b" and are connected with high pressure gas lines.

The conductive metal powder of the present invention is composed of silver and M (wherein M is at least one metal selected from Ni, Co, Cu and Fe). As M, at least one metal selected from Cu and Ni is preferred.

x is not smaller than 0.01 and is not greater than 0.4, but inclusive. With less than 0.01, resistance to oxidation is poor, and conductivity deteriorates with passage of time. It is unnecessary and wasteful to use rare and expensive silver in excess of 0.4. With more than 0.4, electromigration tends to occur readily. Preferably X is shown by $0.02 \leq x \leq 0.2$.

The conductive metal powder of the present invention has a region wherein a silver concentration progressively increases on moving from the core or inner part toward the surface of the particle. It is preferred that the silver concentration on the surface of individual particles is 2.1 times or more than the average silver concentration, more preferably from 3 to 20 times. The most preferable concentration is from 6 to 15 times.

Herein the term "silver concentration" is used to mean $Ag/(Ag+M)$ (atomic ratio, wherein M is at least one metal selected from Ni, Co, Cu, and Fe). The silver concentration at or around the surface is determined by the following method using XPS (X-ray photoelectron spectrometer).

Apparatus: an XPS, manufactured by KRATOS Co., Ltd., England, type XSAM800.

Fixing of Specimen: Specimen powders were so attached to a pressure sensitive adhesive double-coated tape as to completely cover the top previously attached to the specimen stand.

Etching conditions: Argon ion gas was used with accelerating voltage of 3 KEV. The incidence angle of an argon ion beam was 45° to the specimen. The pressure of the analysis chamber was $10^{-7}$ torr. The period for each etching was 10 minutes.

Estimation of the concentration of silver: X-ray beam ($K\alpha$ line of Magnesium, voltage: 12 Kv, current 10 mA) is applied to the specimen. The photoelectron receiver was set in perpendicular to the specimens. The pressure of the analysis chamber was $10^{-8}$ torr. Each measurement of silver concentration was performed after each etching. The measurements were repeated 5 times, and the silver concentration on the surface of the particle was defined as the mean value of the silver concentration of the initial two measurements.

A mean silver concentration was determined using ICP (high frequency induction connected plasma spectrometer) after dissolving a sample in concentrated nitric acid.

Preferred shapes of the conductive metal powder particles of the present invention are spherical and flaky. In the case of the spherical particles the average diameter is preferably from 1 to 100 microns, more preferably from 1 to 30 microns. In the case of flaky particles (i.e., the extended piece), the average diameter (when a long diameter and a short diameter are present, the average diameter being an average of both diameters) is preferably from 1 to 100 microns, more preferably from 10 to 30 microns. A ratio of the diameter to thickness is preferably 3 or more, more preferably from 10 to 100 in the case of flaky articles. For measurement of the shape, a scanning electron microscope was used. The average diameter is calculated from data of 100 pieces.

To prepare the conductive metal powder having an average composition represented by $A_x M_{1-x}$ (wherein M is at least one metal selected from Ni, Co, Cu and Fe: $0.01 \leq x \leq 0.4$) and having the region wherein a silver concentration progressively increases on moving from the core or inner part toward the surface (hereafter referred to as metal powder of the present invention), a molten metal having a composition of $A_x M_{1-x}$ (wherein M is at least one metal selected from Ni, Co, Cu and Fe; $0.01 \leq x \leq 0.4$) is solidified rapidly in an inert gas atmosphere to yield a molten metal powder.

The inert gas is a gas that does not react at all or reacts only extremely slowly and to only a minimal extent with a molten mass of M (wherein M is at least one metal selected from Ni, Co, Cu and Fe) (hereafter referred to as molten metal of the present invention). Examples of the inert gas are argon, helium, nitrogen and mixtures thereof.

For rapid solidification in the form of fine particles, there are several methods. The molten metal of the present invention is, e.g., ejected from a crucible to impinge on a high speed rotor having good thermal conductivity Alternatively, an inert gas under high pressure is jetted through nozzles, etc., to and through a stream of molten metal of the present invention ejected from a crucible so that the generated high-speed stream of inert gas impinges against and atomizes the molten metal of the present invention (high pressure gas atomization), etc. High pressure gas atomization is preferred. The core part of the high pressure gas atomization apparatus is shown in FIG. 1. The mixture of the metals of the composition of this invention is charged in the crucible (symbol a), is heated with such as high frequency induction heater and the mixture is molted. The molten mixture is ejected from the nozzle (symbol b) which is attached to the bottom of the crucible (symbol a). A high pressure gas is jetted through the nozzles (symbol c and d) to expand adiabatically, a high speed gas stream is generated and the generated gas stream impinges on the ejected molten metal stream. The gas used is advantageously inert gas. A gas pressure is preferably at least 50 kg/cm$^2$g, more preferably 70 kg/cm$^2$g or more and most preferably 100 kg/cm$^2$g or more. The inner diameter of the nozzles (symbol c and d) is preferably between 0.1 and 2 mm and more preferably between 0.5 and 1.5 mm. The angle between the stream of the molten metal and that of gas jetted is preferably between 2 and 80 degree and more preferably between 30 and 60 degree.

A velocity of the high speed gas stream is preferably 100 m/sec at the impingement position against the molten metal or more, and more preferably 300 m/sec or more. The most preferable velocity is 600 m/sec or more. A weight ratio of the gas to the molten metal is preferably 2 or more, and more preferably 10 or more. The most preferable weight ratio is 10 to 2000.

In the method for preparing the conductive metal powder of the present invention, a cooling rate for solidifying the molten metal is preferably $10^2$.C/sec or more, and more preferably $10^3$.C/sec or more.

Where a rotor is used in the preparation of the conductive metal powders of the present invention, materials for the rotor are preferably metals having a good thermal conductivity, such as copper, copper alloys, stainless steel, etc. The shape of the rotor is advantageously conical or disc-like. The linear running velocity of the rotor is preferably 1000 to 10000 m/min, more preferably 1000 to 5000 m/min, at the impingement position against the molten metal. The ejection rate of the metal is preferably between 1 and 1,000 g/sec, more preferably, between 10 and 30 g/sec. The distance from the tip of the nozzle through which a molten mixture is ejected to the point of the rotor at which the stream of the molten metal impinges is preferably between 3 and 50 cm and, more preferably, between 5 and 15 cm. The rotor may also be equipped with a cooling mechanism.

The conductive metal flaky-form powder is optionally fabricated through, e.g., milling powder obtained with rapid solidification of the metal. The metallic conductive powders of the present flaky shape may be fabricated through extending the powders thus obtained by rapidly solidifying the molten metal of the present invention.

For extending the powders obtained by rapidly solidifying the molten metal of the present invention, there is, for example, a method for mechanical extension using a ball mill, etc. It is preferred to perform extension in an inert or reductive atmosphere, more preferably in an inert liquid. As the inert liquid, there are organic solvents, such as mineral spirits, solvent naphtha, etc. The amount of inert liquid is preferably from 1 to 1000 ml/g of powder. In this case, known dispersing aids may also be added.

A mechanism for forming conductive powder of the present invention involves concentrating low melting silver on the surface of powder particles but this is not intended to limit the scope of the invention. By a high speed gas stream, droplets of molten metal are formed, and rapid solidification of the droplets occurs while they are impelled at a high speed accompanied by a high-speed gas stream. As the rapid solidifying process proceeds under such circumstances, the liquid phase, rich with low melting silver, presumably comes onto the surface during the solidification and then solidifies on the surface with delay, thereby preparing powders rich in silver on the surface of the particle.

The conductive metal powders of the present invention are prepared by rapidly solidifying the molten metal by high pressure gas atomization, etc. The method of the present invention provides a smooth surface since washing with hydrochloric acid is omitted.

The conductive metal powder of the present invention is useful as conductive material for electric circuits, etc. Preferred examples of application include electric leads to or between electric circuit elements, electrodes for the elements, such as resistance, condenser, etc., adhesive with conductivity, membrane for shielding electromagnetic interference, etc. When the conductive metal powder of the present invention is utilized as above, it is advantageous to apply powder in a paste form, which is prepared by adding a binder to the powder (such a paste is generally termed a conductive paste but may also be called a conductive paint or a conductive adhesive depending upon the application; all options and alternatives are included within the scope of the invention). For the application procedure, printing, such as screen printing, etc., coating and the like are used. Particles of a conductive metal powder of the present invention are preferably in a spherical or flaky form, or a mixture thereof. After the conductive paste of the present invention is applied, a heat treatment may also be performed to improve contact between the conductive powder particles. The binder used for the conductive paste of the present invention is preferably an organic binder in view of processability, mechanical strength, etc. In the case of using organic binder, the conductive metal powder is advantageously composed of flaky particles in view of conductivity. The organic binder used is preferably an organic resin, such as thermoset resin, photocurable resin, irradiation-curable resin, thermoplastic resin and the like. Examples of the organic binder include epoxy resin, phonolic resin, urethane resin, acrylic resin, etc.

In order to improve processability of the conductive paste of the present invention, a solvent may also be used. It is advantageous to incorporate a small quantity of carboxylic acid (higher fatty acids, such as linoleic acid, palmitic acid, etc., or oxycarboxylic acids, such as malic acid and the like) to improve the conductivity, into the conductive paste of the present invention, though it is not essential. When a carboxylic acid is added, the amount thereof is preferably from 0.1 to 10 wt. %.

EXAMPLE 1

Copper powder (purity of 99.9% or more, manufactured by KOJUNDO KAGAKU K.K), 63 g, was mixed with 5 g of silver powder (purity of 99.9% or more, manufactured by KOJUNDO KAGAKU K.K.). The mixture was charged into a graphite crucible (equipped with a nozzle), melted in an argon atmosphere with a high frequency induction heater and heated up to 1300° C. The molten mass was ejected from the nozzle for 10 seconds in an argon atmosphere under roughly atmospheric pressure. At the same time, 1.7 NTPm$^3$ of argon gas up in a high-pressure cylinder (with cylinder pressure of 150 atms), which was connected to the nozzles through tubes, was jetted from the nozzles toward the ejected molten mass (gas linear velocity of 200 m/sec).

Figure 2:
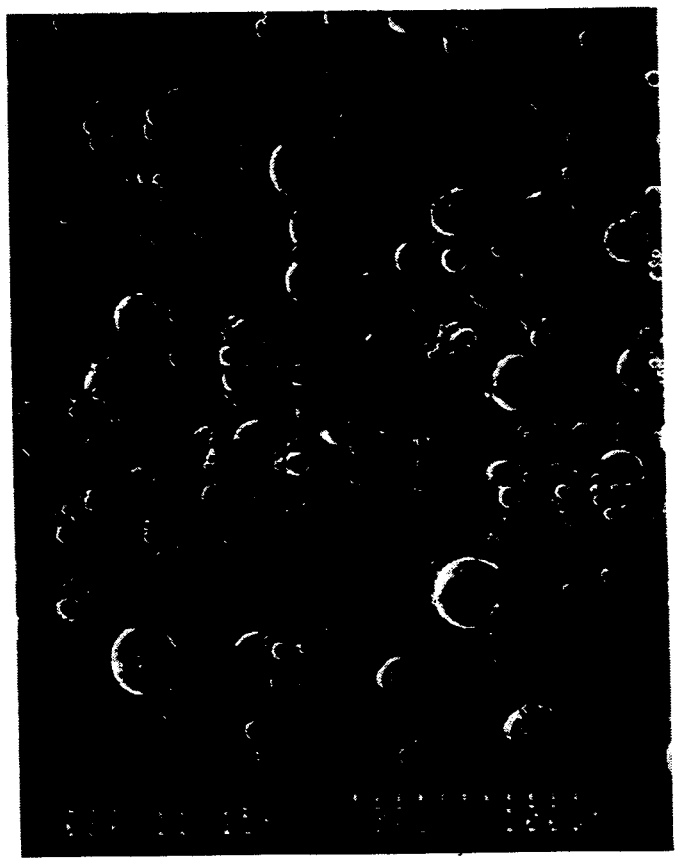
FIG. 2 is a microscopic picture of spherical metal powder particles in accordance with the present invention.

The ejected molten mass was thus atomized and rapidly solidified in the gas stream. The weight by weight ratio of the velocity of gas to the velocity of molten mass was 45. The resulting powder particles were observed and found to be spherical (mean diameter of 35 $\mu$m) with a scanning electron microscope. In FIG. 2, an electron microscopic picture of the particles is shown.

Figure 3:
FIG. 3 is a microscopic picture of the flaky metal powder of the present invention.

The obtained particles of 15 $\mu$m or less in diameter were milled with a vibration ball mill packed with 15 mm$\Phi$ stainless balls in 100 ml of mineral spirits in a nitrogen atmosphere. The mean diameter and mean thickness of the resulting flaky particles were 22 $\mu$m and 1.2 $\mu$m, respectively. An electroscopic picture of the particles is shown in FIG. 3. The obtained powder particles were analyzed using XPS. The measurement data for Ag/(Ag+Cu) (atomic ratio) were 0.4, 0.34, 0.31, 0.27 and 0.22, moving from the surface toward the inner part with etching and measurement. The silver concentration on the surface was 0.37. The mean silver concentration (Ag/(Ag+Cu), atomic ratio, determined with ICP was 0.0448, indicating that the silver concentration on the surface was 8.3 times that of the mean silver concentration.

The flaky powder particles, 3 g, were dispersed in a solution composed of 2 g of commercially available acrylic thermoplastic resin, 0.5 g of ethyl cellosolve and 0.15 g of linoleic acid. A polyester film was coated with the resulting dispersion of the present powder, which was dried at 50° C. The thickness of the coating layer [determined with the difference measured by using a surface contour measuring instrument (Slirfcom 770 purchased from Tokyo Seimitsu Co.)] was 20 $\mu$m. Volume resistivity determined by the bridge method was $3 \times 10^{-4} \Omega.\text{cm}$. The film was allowed to stand in the air at 80° C. for 400 hours under a relative humidity of 70%. No substantial change in volume resistivity was noted.

EXAMPLE 2

Copper powder, 63 g, having the same purity as used in Example 1, was mixed with 5 g of silver powder. The mixture was charged into a graphite crucible equipped with a nozzle and melted in an argon atmosphere with a high frequency induction heater and was heated up to 1350° C. The molten mass was ejected for 10 seconds from the nozzle under atmospheric pressure. At the same time, 2 NTPm³ of argon gas [in a high pressure cylinder (cylinder pressure of 150 atms) which was connected to nozzles through tubes] was jetted from the nozzles toward the ejected molten mass (gas linear velocity of 160 m/sec). The weight by weight ratio of the velocity of gas to the velocity of molten mass was 53. The resulting powder particles had a mean diameter of 20 μm. Among the powder particles obtained, the powder particles of 10 μm or less were suspended in 100 ml of mineral spirits in a nitrogen atmosphere and placed on a vibration ball mill. Flaky particles having a mean diameter of 35 μm and a mean thickness of 0.5 μm were obtained.

The obtained flaky powder was analyzed using XPS. The measurement data for (Ag/(Ag+Cu)) were 0.354, 0.34, 0.32, 0.28 and 0 24 on moving from the surface toward the inner part with etching and measurement. The silver concentration on the surface was 0.347. The mean silver concentration was 0.0447, indicating that the silver concentration on the surface was 7.7 times that of the mean silver concentration.

Flaky powder, 3 g, was dispersed in a solution composed of 2 g of commercially available acrylic thermoplastic resin and 0.5 g of ethyl cellosolve. A polyester film was coated with the resulting dispersion containing the present powder. The thickness of the coated layer was 25 μm. Volume resistivity determined by the bridge method was $4 \times 10^{-4} \Omega.\text{cm}$. The film was allowed to stand in the atmosphere at 80° C. for 400 hours under a relative humidity of 75%. No substantial change in volume resistivity was noted.

EXAMPLE 3

Copper powder, 150 g, having the same purity as used in Example 1, was mixed with 40 g of silver powder. The mixture was charged in a graphite crucible equipped with a nozzle and melted in a helium atmosphere with a high frequency induction heater and was heated up to 1360° C. The molten mass was ejected into a helium atmosphere under atmospheric pressure from the nozzle. At the same time, 4 NTPm³ of helium gas in a high pressure cylinder (cylinder pressure of 200 atms), which was connected to nozzle through tubes, was injected from the nozzles toward the molten mass (gas linear velocity of 300 m/sec) to solidify the molten mass rapidly. The weight by weight ratio of the mass velocity of gas to the velocity of molten mass was 3.5. The resulting powder was composed of spherical particles having a mean particle diameter of 21 μm. The obtained powder (have a particle Size Of 10 μm or less) were subjected to ball milling in a manner of similar to that of Example 2. The resulting flaky particles had a mean diameter of 20 μm and a mean thickness of 1 μm. The resulting powder was analyzed using XPS. The measurement data of Ag/(Ag+Cu) were 0.85 0.82, 0.80, 0.76 and 0.75 on moving from the surface toward the inner part with etching and measurement. The silver concentration on the surface was 0.835. The mean silver concentration was 0.13. The silver concentration on the surface was 6.4 times that of the mean silver concentration. Using 3 g of the flaky particles, a coated layer was prepared in a manner similar to that of Example 2.

Volume resistivity of the coating layer was $3 \times 10^{-4}$ Ω.cm. The coated film was allowed to stand in the atmosphere at 40° C. for 1000 hours under a relative humidity of 75%. No substantial change in volume resistivity was noted.

EXAMPLE 4

Copper powder, 95 g, was mixed with 5 g of silver powder. The mixture was charged into a graphite crucible with a nozzle, was melted in an argon atmosphere with a high frequency induction heater and was heated up to 1320° C. The molten mass was injected for 10 seconds into an argon atmosphere under atmospheric pressure from a nozzle. At the same time, 4 NTPm³ of argon gas in a high pressure cylinder (cylinder pressure of 200 atms), which was connected to nozzles through tubes, was injected from the nozzles toward the ejected molten mass (gas linear velocity of 500 m/sec) to solidify the molten mass rapidly. The weight by weight ratio of the velocity of gas to the velocity of molten mass was 71. The resulting powder had a mean particle diameter of 20 μm. 3 g of the obtained particles of 12 μm or less were subjected to ball milling in a manner similar to that of Example 2 to prepare a powder of flaky particles. The flaky particles had a mean diameter of 25 μm and a mean thickness of 1 μm.

The powder was analyzed using XPS. The measurement data for (Ag/(Ag+Cu)) were 0.35, 0.32, 0.27, 0.25, and 0.22 on moving from the surface toward the inner part with etching and measurement. The silver concentration on the surface was 0.335. The mean silver concentration was 0.03, indicating that the silver concentration on the surface was 11.2 times that of the mean silver concentration.

Flaky powder particles, 3 g, similarly prepared as shown above, were dispersed in a solution composed of 2 g of commercially available acrylic thermoplastic resin and 0.5 g of ethyl cellosolve. A commercially available polyester film was coated with the resulting dispersion containing the powder, which was allowed to stand for drying. The thickness of the obtained coated layer was 25 μm. Volume resistivity was $5 \times 10^{-4}$ Ω.cm. The film with the coated layer was allowed to stand in the atmosphere at 40° C. for 1000 hours under a humidity of 95%. No substantial change in volume resistivity was noted.

Flaky powder particles, 3 g, similarly prepared as shown above were dispersed in a solution composed of 2 g of commercially available acrylic thermoplastic resin and 0.5 g of ethyl cellosolve. A polyester film was coated with the resulting dispersion containing the powder in a manner similar to that of Example 1 to form two coated layers having a width of 10 mm and a length of 70 mm in the shape of two stripes each and with 1 mm spacing. On the gap between the two stripes 0.2 ml of water droplet was dropped and a direct current voltage of 5 V was applied between the two stripes for 15 seconds. No change in appearance was noted either on the gap or on the two stripes. No migration of silver into the gap between the stripes was noted also with EMPA (Electron Probe Microanalyzer) analysis.

EXAMPLE 5

Silver powder, 4 g, was mixed with 59 g of nickel powder. The mixture was melted in a graphite crucible with a nozzle made of boron nitride and heated up to 1300° C. in a manner similar to that of Example 1. The molten mass was jetted for 5 seconds toward a position of 5 mm from the center of a copper-made rotary disc (diameter of 200 mm, rotating speed of 10,000 rpm). At the same time, 1.9 NTPm$^3$ of argon gas in a high pressure cylinder (cylinder pressure of 100 atms), which was connected to the nozzle through tubes, was jetted toward the ejected molten mass (gas linear velocity of 210 m/sec) to solidify the molten mass rapidly. The weight by weight ratio of the velocity of gas to the velocity of molten mass was 63. The resulting powder particles were spherical (mean diameter of 20 $\mu$m). Among the spherical powder particles obtained, the powders having a particle diameter of 10 $\mu$m or less, were ball milled in a manner similar to that of Example 1. The obtained powder particles were flaky and had a mean diameter of 20 $\mu$m and a mean thickness of 1 $\mu$m. The powder particles were analyzed using XPS. The obtained data for Ag/(Ag+Ni) (atomic ratio) were 0.5, 0.444, 0.41, 0.38, and 0.35 on moving from the surface toward the inner part with etching and measurement. The silver concentration on the surface was 0.472. The mean silver concentration was 0.0336, indicating that the silver concentration on the surface was 13.3 times that of the mean silver concentration.

A film with a coated layer was prepared in a manner similar to that of Example 1, except for using the resulting flaky powder of the present Example. The thickness of the coated layer was 15 $\mu$m. Volume resistivity was $1\times10^{-3}$ $\Omega$.cm. The film was allowed to stand in the air at 80° C. for 400 hours under a relative humidity of 70%. No substantial change in volume resistivity was noted.

EXAMPLE 6

Silver powder, 10 g, was mixed with 60 g of nickel powder. The mixture was melted in a graphite crucible with a nozzle made of boron nitride and was heated to 1350° C. by high frequency induction heating. The resulting molten mass was ejected for 10 seconds into a helium atmosphere under atmospheric pressure. At the same time, 4 NTPm3 of argon gas in a high pressure cylinder (cylinder pressure of 100 atms), which was connected to nozzles through tubes was jetted from the nozzles (gas linear velocity of 320 m/sec) toward the ejected molten mass. The weight by weight ratio of the velocity of gas to the velocity of molten mass was 53. The resulting powder particles have a mean diameter of 18 $\mu$m. Among the powder particles those of 12 $\mu$m or less were subjected to vibration ball milling in 100 ml of mineral spirits under a nitrogen atmosphere. Flaky powder particles having a mean diameter of 25 $\mu$m and a mean thickness of 1 $\mu$m were obtained.

The obtained powder particles were analyzed using XPS. The measurement data of Ag/(Ag+Ni) were 0.90, 0.85, 0.81, 0.78 and 0.73 on moving from the surface to the inner part with etching and measurement. The silver concentration on the surface was 0.875. The mean silver concentration was 0.08, indicating that the silver concentration on the surface was 10.9 times that of the mean silver concentration.

A coated film was prepared in a manner similar to that of Example 2, except for using 3 g.of the resulting flaky powder particles. The thickness of the coated layer was 15 $\mu$m. Volume resistivity was $8\times10^{-4}$ $\Omega$.cm. The film was allowed to stand in the air at 40° C. for 1000 hours under a relative humidity of 95%. No substantial change in volume resistivity was noted.

EXAMPLE 7

Copper powder, 135 g, was mixed with 15 g of silver powder. The mixture was charged into a crucible with a nozzle, melted and heated up to 1340° C. in a helium atmosphere by high frequency induction heating. The molten mass was ejected for 20 seconds into a helium atmosphere under atmospheric pressure. At the same time, 6 NTPm$^3$ of helium gas in a high pressure cylinder (cylinder pressure of 110 atms), which was connected to nozzles through tubes, was jetted from the nozzles toward the ejected molten mass to solidify the molten mass rapidly.

The resulting powder was classified with a powder jet classifier. The obtained spherical particles of from 5 to 10 $\mu$m in diameter were analyzed using XPS. The measurement data of Ag/(Ag+Cu) were 0.70, 0.50, 0.42, 0.39 and 0.36 on moving from the surface to the inner part with etching and measurement. The silver concentration at the surface was 0.60. The mean silver concentration was 0.06, indicating that the silver concentration on the surface was 10 times that of the mean silver concentration.

EXAMPLE 8

Copper powder, 120 g, was mixed with 30 g of silver powder. The mixture was charged into a graphite crucible with a nozzle, melted and heated up to 1410° C. in a helium atmosphere by high frequency induction heating. The obtained molten mass was ejected for 20 seconds into a helium atmosphere under atmospheric pressure. At the same time, 6 NTPm$^3$ of helium gas in a high pressure cylinder (cylinder pressure of 110 atms), which was connected to nozzles through tubes, was jetted from the nozzles toward the ejected molten mass to solidify the molten mass rapidly.

The resulting powder was classified with a powder jet classifier. The resulting spherical particles of about 2 $\mu$m in diameter were analyzed using XPS. The measurement data of Ag/(Ag +Cu) were 0.74, 0.69, 0.63, 0.60, and 0.57 on moving from the surface to the inner part with etching and measurement. The silver concentration on the surface was 0.72. The mean silver concentration was 0.128, indicating that the silver concentration on the surface was 5.6 times that of the mean silver concentration.

EXAMPLE 9

Flaky powder, 3 g, obtained in Example 1 was mixed with 2 g of epoxy-melamine thermosetting resin, 2 g of methyl ethyl ketone and 0.15 g of linoleic acid. A paper-phenolic resin plate was coated with the resulting mixture and was heated at 150° C. for an hour in the air. The volume resistivity of the resulting coated layer was $2\times10^{-4}$ $\Omega$.cm, which was measured by the bridge method. The plate was allowed to stand in the atmosphere at 80° C. for 400 hours under a relative humidity of 95%. No substantial change in volume resistivity was noted. Furthermore, an electromigration test was carried out in a manner similar to that of Example 4. No silver migration was observed either with the naked eye or with EMPA analysis.

EXAMPLE 10

Copper powder, 63 g, was mixed with 5 g of silver powder. The mixture was charged into a graphite crucible with a nozzle, melted and heated up to 1360° C. in a helium atmosphere by high frequency induction heating. The obtained molten mass was ejected into a helium atmosphere under atmospheric pressure. At the same time, 4 NTPm$^3$ of helium gas in a high pressure cylinder (cylinder pressure of 100 atms), which was connected to nozzles through tubes, was injected from the nozzles toward the ejected molten mass (gas linear velocity of 300 m/sec). The weight by weight ratio velocity of gas to the velocity of molten mass was 10.

The resulting powder particles were spherical with a mean diameter of 18 μm. Using XPS, data obtained for Ag/(Ag+Cu) were 0.375, 0.33, 0.3, 0.25, and 0.2 on moving from the surface to the inner part with etching and measurement. The silver concentration on the surface was 0.354. When measured with ICP, a mean silver concentration of the powders was 0.448. The silver concentration in the surface was 7.9 times that of the mean silver concentration The powder particles of 2 μm or less in diameter were classified from the resulting powders with a powder jet classifier. The powder, 3 g, was mixed with 0.75 g of ethyl cellulose and 0.75 g of commercially available methacrylic thermoplastic resin. A quartz glass plate was coated with the resulting mixture, which was dried and heated at 700° C. for an hour in a nitrogen atmosphere containing a small amount of oxygen. The thickness of the coating layer was 15 μm, and measured volume resistivity was $5 \times 10^{-6}$ Ω.cm

COMPARATIVE EXAMPLE 1

A polyester film was coated in a manner similar to that of Example 1 except for using a commercially available copper powder (FCC115) instead of the powders prepared in Example 1 to prepare a coating mixture. The thickness of the coated layer was 30 μm, and the volume resistivity was $3 \times 10^{-3}$ Ω.cm.

COMPARATIVE EXAMPLE 2

A polyester film was coated in a manner similar to that of Example 1 except for using commercially available silver-plated copper powder (manufactured by Mitsui Mining and Smelting Co., Ltd, 5 wt. % Ag) instead of the powders prepared in Example 1 to prepare a coating mixture The thickness of the coated layer 25 μm, and volume resistivity was $6 \times 10^{-2}$ Ω.cm. With respect to this coating film, an electromigration test was conducted in a manner similar to that of Example 4. Blackening was observed with the naked eye on the gap between the two stripes, and this suggested that silver migration occurred therebetween. Also, on analysis using EMPA, marked migration of silver into the gap between the stripes was noted.

COMPARATIVE EXAMPLE 3

Copper powder, 50 g, was mixed with 50 g of aluminum powder (purity of 99.9% or more, manufactured by KOJUNDO KAGAKU K.K.). The mixture was charged into a graphite crucible equipped with a nozzle, was melted and heated up to 1300° C. in an argon atmosphere with high frequency induction heating. The molten mass was ejected from the nozzle for 10 seconds in a helium atmosphere under atmospheric pressure. At the same time, 3 NTPm$^3$ of argon gas in a high pressure cylinder (cylinder pressure 100 atms), which was connected to nozzles through tubes, was injected from the nozzles toward the ejected molten mass (gas linear velocity of 220 m/sec). The weight by weight ratio of the velocity of gas to the velocity of molten mass was 5.3. The resulting powder obtained by rapid solidification had a mean diameter of 20 μm. Among the powder particles obtained, 12 g of powder particles of 10 μm or less in diameter were subjected to vibration ball milling in a nitrogen atmosphere together with 100 ml of mineral spirits. Flaky powder particles having a mean diameter of 30 μm and a mean thickness of 2 μm were obtained. The obtained flaky powder particles were analyzed using XPS. Data for Ag/(Ag+Al) were 0.01, 0.04, 0.06, 0.1 and 0.14 on moving away from the surface into the inner part with etching and measurement. The silver concentration on the surface was 0.025. The mean silver concentration was 0.2, indicating that the silver concentration on the surface was 0.125 times that of the mean silver concentration.

Using 3 g of the obtained flaky powder, a coated film was prepared in a manner similar to that of Example 1. Volume resistivity of the coated layer was as large as $4 \times 10^{-1}$ Ω.cm.

COMPARATIVE EXAMPLE 4

Silver, 65 g, was mixed with 25.4 g of copper. The mixture was charged in a graphite crucible equipped with a nozzle, melted and heated up to 1300° C. The molten mass was ejected from the nozzle into a helium atmosphere. At the same time, 0.3 NTPm$^3$ of helium gas (5 atms) was jetted toward the ejected molten mass for 10 seconds. The weight by weight ratio of the velocity of gas to the velocity of molten mass was 0.6. The resulting powder particles were spheric having a mean diameter of 60μ. Among the powder particles obtained, g of the powder particles of 10 μm or less in diameter were suspended in 40 ml of mineral spirits and subjected to vibration ball milling to yield flaky powder particles. The flaky powder particles had a mean diameter of 5 μm and a mean thickness of 1 μm. As a result of XPS analysis, data for Ag/(Ag +Cu) were 0.7, 0.65, 0.61, 0.6, and 0.6 on moving away from the surface toward the inner part with etching and measurement. The silver concentration on the surface was 0.67. The mean silver concentration was 0.6, indicating that the silver concentration on the surface was about 1.1 times that of the mean silver concentration.

Using the obtained flaky powder, a coated film was prepared in a manner similar to that of the preparation of the coated film of Example 4 for an electromigration test. The electromigration test was performed in a manner similar to that of Example 4. Blackening occurred in the gap between the two stripes due to migration of silver. Also, on analysis with EPMA, remarkable silver migration into the gap was observed.

COMPARATIVE EXAMPLE 5

Silver powder, 0.108 g, was mixed with 63.5 g of copper powder. The mixture was charged into a crucible equipped with a nozzle, melted with high frequency induction heating and heated up to 1350° C. The molten mass was ejected from the nozzle for 10 seconds into a helium atmosphere under atmospheric pressure. At the same time, 3 NTPm$^3$ of helium gas in a high pressure cylinder (cylinder pressure of 100 atms), which was connected to nozzles through tubes, was jetted toward the ejected molten mass (gas linear velocity of 220 m/sec). The weight by weight ratio of the velocity of gas to the velocity of molten mass was 7. The resulting powder particles had a mean diameter of 18 μm. Among the powder particles obtained, 10 g of the powder particles of 10 μm or less in diameter were subjected to vibration ball milling in a nitrogen atmosphere together with 100 ml of mineral spirits. As a result of XPS analysis, data for Ag/(Ag+Cu) were 0.005, 0.0045, 0.004, 0.003 and 0.002 on moving from the surface toward the inner part with etching and measurements. The silver concentration on the surface was 0.00475. The mean silver concentration determined by ICP was 0.001, indicating that the silver concentration on the surface was about 4.7 times that of the mean silver concentration. Using the powder, a coated film was prepared in a manner similar to that in Example 1. The thickness of the coated layer was 20 μm, and the measured volume resistivity was as large as $3 \times 10^{-3}$ Ω.cm. The resistivity increased to $8 \times 10^{-3}$ Ω.cm while the coated film was allowed to stand for 400 hours at 80° C. under a relative humidity of 90%.

As described above, the present invention provides conductive metal powder (using a small quantity of rare silver) which has high and stable conductivity, suffers almost no silver electromigration as compared to the cases of silver or silver plated copper wherein they suffer it very much, and is suitable as leads, as electrodes, as adhesive with conductivity and as shielding for electromagnetic interference.

What is claimed is:

1. Conductive metal powder having an average composition represented by $Ag_x M_{1-x}$ (wherein M is at least one metal selected from the group consisting of Ni, Co, Cu and Fe; $0.01 \leq x \leq 0.4$) and component particles wherein silver concentration progressively increases from an inner part toward the surface of such particles.

2. Conductive metal powder of claim 1, wherein the silver concentration on the surface of component particles is at least 2.1 times the mean silver concentration of the component particles.

3. Conductive metal powder of claim 1 or 2, wherein said conductive metal powder consists essentially of spherical particles.

4. Conductive metal powder of claim 1 or 2, which has a mean particle diameter less than 100 μm.

5. Conductive metal powder of claim 1 or claim 2, wherein particles comprising the conductive metal powder are flaky particles.

6. Conductive metal powder of claim 5, wherein the flaky conductive metal particles have a mean diameter from 1 to 100 μm and a ratio of diameter/thickness of at least 3.

7. A conductive paste comprising conductive metal powder as claimed in claim 1 and binder.

8. A conductive paste of claim 7, wherein the binder is an organic binder.

9. A conductive paste of claim 7 or claim 8, wherein said conductive metal powder mainly comprises flaky particles.

10. A printing paste which is a conductive paste of one of the claims 7 and 8.

11. A conductive adhesive composition comprising a conductive paste of one of claims 7 and 8.

12. A shielding layer for electromagnetic interference comprising conductive paste of claim 8.

13. A lead for a printed circuit comprising conductive paste of one of claims 7 and 8.

* * * * *